United States Patent
Guzik et al.

(10) Patent No.: US 6,219,683 B1
(45) Date of Patent: Apr. 17, 2001

(54) RADIALLY DISTRIBUTED TRANSVERSE FILTER

(75) Inventors: Nahum Guzik, Palo Alto; Anatoli Stein, Los Altos, both of CA (US)

(73) Assignee: Guzik Technical Enterprises, San Jose, CA (US)

( * ) Notice: Subject to any disclaimer, the term of this patent is extended or adjusted under 35 U.S.C. 154(b) by 0 days.

(21) Appl. No.: 09/124,129

(22) Filed: Jul. 29, 1998

(51) Int. Cl.⁷ .................................................. G06F 17/10
(52) U.S. Cl. ............................................................ 708/319
(58) Field of Search ................................. 708/290, 300, 708/301, 313, 319

(56) References Cited

U.S. PATENT DOCUMENTS

| | | | |
|---|---|---|---|
| 3,078,426 | 2/1963 | Foundas | 333/71 |
| 3,248,558 | 4/1966 | Seif | 307/88.5 |
| 3,378,697 | 4/1968 | Preston et al. | 307/225 |
| 3,482,190 | 12/1969 | Brenin | 333/29 |
| 4,097,886 | 6/1978 | Baertsch et al. | 357/24 |
| 4,105,958 | 8/1978 | Pierce et al. | 333/29 |
| 4,173,003 | 10/1979 | Thies | 333/165 |
| 4,255,725 | 3/1981 | Berger et al. | 333/165 |
| 4,259,597 | 3/1981 | Tiemann | 307/221 D |
| 4,264,983 | 4/1981 | Miller | 364/825 |
| 4,288,764 | 9/1981 | Ong | 333/165 |
| 4,320,363 | 3/1982 | Kaschte | 333/165 |
| 5,084,866 | 1/1992 | Buttle | 370/32.1 |
| 5,404,322 | * 4/1995 | Gehring | 708/319 |
| 5,442,582 | 8/1995 | Lange et al. | 364/825 |
| 5,694,377 | 12/1997 | Kushnick | 368/120 |

* cited by examiner

*Primary Examiner*—Ohuong Dinh Ngo
(74) *Attorney, Agent, or Firm*—McDermott, Will & Emery

(57) ABSTRACT

A radially distributed transverse filter includes a plurality of delay lines of substantially equal electric length sequentially coupled at a like plurality of nodes. The nodes are distributed equidistant from a common position, for example positioned at vertices of a polygon. A plurality of attenuators are distributed radially about the common position and coupled between the nodes and the common position. An adder is located substantially at the common position for summing the attenuator outputs. In this manner, the respective propagation delays of each tap are substantially similar, and imprecision due to variation in propagation delay is therefore mitigated and/or substantially eliminated. The invention has application to high-frequency digital and analog transverse filters, for example filters for equalizers used in Partial Response Maximum Likelihood (PRML) circuits employed in contemporary magnetic recording systems.

21 Claims, 1 Drawing Sheet

RADIALLY DISTRIBUTED TRANSVERSE FILTER

BACKGROUND OF THE INVENTION

Transverse filters are multiple-stage spatial processing networks which allow for variable control of phase and/or amplitude response. Each stage, or tap, of a transverse filter includes a delay line and a leg. The delay lines of adjacent taps are coupled in series at a node. A signal applied to a tap is delayed a predetermined time interval by the delay line. The time interval is determined by the properties of the delay line material, i.e. the propagation constant, and by the geometry of the line layout, i.e. length and width. This is referred to as the "electric length" of the line. The delayed signal at each leg is applied to a multiplier. The attenuated signals of all taps are, in turn, summed at an adder. Phase/frequency equalizers are commonly applied to each delay line to avoid accumulation of phase/frequency and amplitude/frequency distortions of the delay lines at successive taps.

Variation in the electric length of taps in a filter, for example variation in the electric length of a delay line and/or the electric length of a leg can limit device performance. Assuming a trace delay of approximately 1.5 nsec per foot of trace, a difference in length between taps of as little as 1 inch can cause signals from different taps arriving at the adder to lag or lead each other by as much as 125 psec. In high-frequency applications, for example for the processing of signals of a frequency range on the order of 0.5 GHz, delay variations of such a high magnitude can have an adverse effect on filter response.

Variations in trace length of the leg between the node and the adder may be compensated for by selecting different delay line lengths for each tap. However, such a configuration would require different amounts of phase/frequency equalization at each tap and would complicate filter layout.

SUMMARY OF THE INVENTION

The present invention is directed to a transverse filter configuration which overcomes the limitations of conventional systems. Specifically, the taps of the transverse filter of the present invention are of substantially equal electric length. In this manner, imprecision due to propagation delay is mitigated and/or eliminated, and accurate processing of high-frequency signals can be achieved.

In a preferred embodiment, the transverse filter of the present invention comprises a plurality of delay lines of substantially equal propagation delay. The delay lines are sequentially connected at a plurality of nodes. The nodes are distributed substantially equidistant from a common position. An adder is located substantially at the common position. A plurality of attenuators are distributed radially about the common position and coupled between the nodes and the adder, such that the propagation delays of the attenuators are substantially equal.

In a preferred embodiment, the delay lines are of substantially equal electrical length. The attenuators are likewise of substantially equal electrical length. Each delay line and attenuator pair forms a tap, and all taps are preferably of equal electrical length. One of the taps is preferably an input tap for introducing an input signal to the filter. An input signal, applied to the input tap, is delayed as it propagates through the delay lines between nodes. The delayed signal at each node is attenuated by one of the attenuators, and the attenuated signals of all taps are summed at the adder to provide an output signal. The propagation delays of the respective signals through the taps are preferably substantially equal.

The nodes are preferably positioned substantially at vertices of a polygon. In a preferred embodiment, the polygon is an equilateral polygon, or circle.

Amplitude and/or phase correctors may be positioned along the delay lines, between nodes. The attenuators preferably comprise four-quadrant multipliers.

BRIEF DESCRIPTION OF THE DRAWINGS

The foregoing and other objects, features and advantages of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF THE PREFERRED EMBODIMENT

Figure 1:
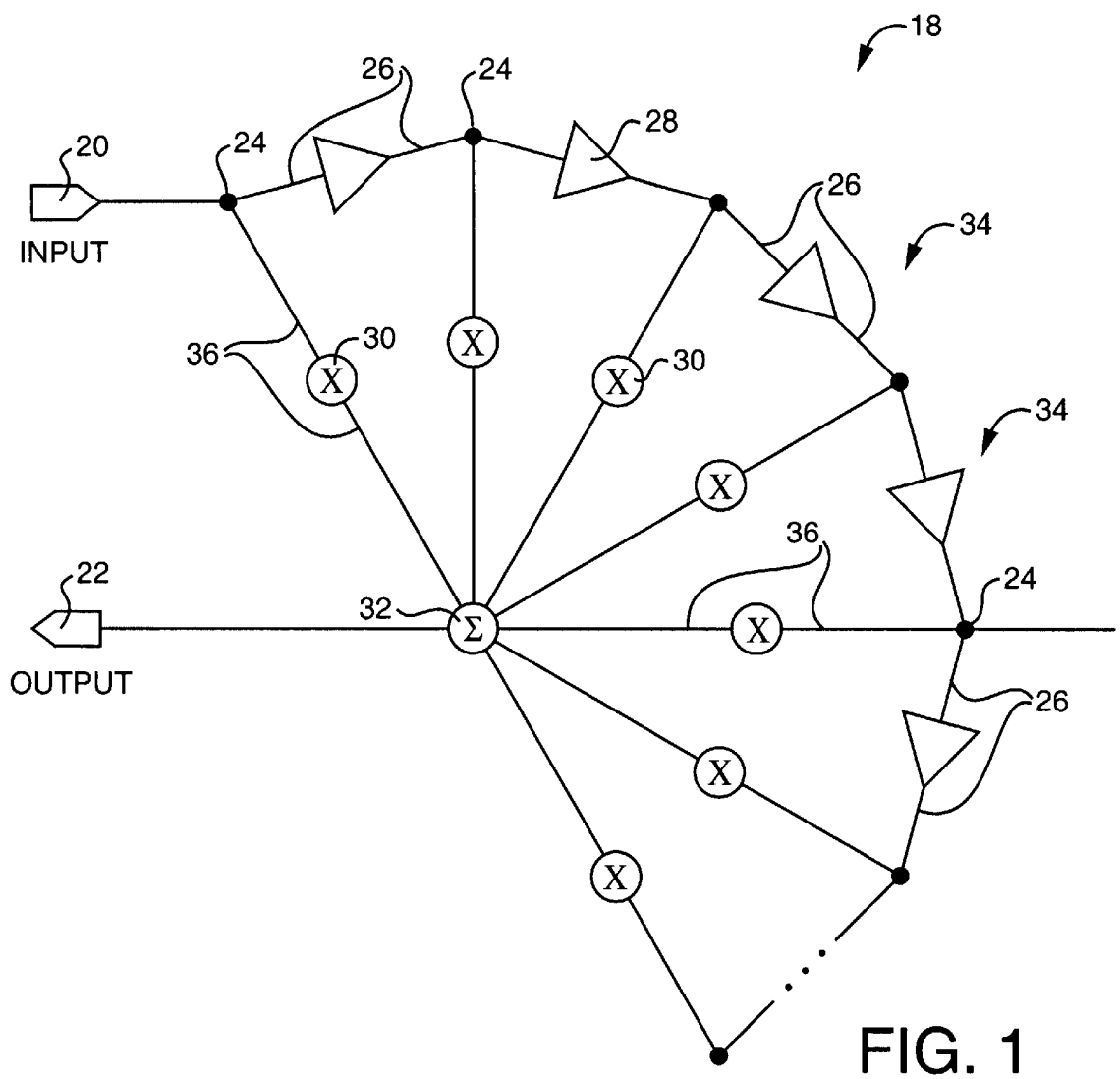
FIG. 1 is a schematic diagram of a radially distributed transverse filter layout in accordance with the present invention.

FIG. 1 is a schematic diagram of radially-distributed transverse filter configuration in accordance with the present invention. In a preferred embodiment, the transverse filter 18 includes an input terminal 20, a plurality of delay lines 26, a plurality of attenuators 30, an adder 32 and an output terminal 22. The delay lines 26 are electrically coupled in series at nodes 24. Each attenuator 30 is coupled between a node 24 and the adder circuit 32 via leg trace 36.

Signals applied to input terminal 20 propagate between nodes 24 along the delay lines 26. At each stage, the delayed signal is attenuated by attenuator 30 and propagates along leg trace 36 to adder 32. The attenuated signals are summed by adder 32 and the resulting summed output signal is applied to output terminal 22.

The delay lines 26 are preferably of substantially equal electric length such that the propagation delay of a signal between nodes 24 is substantially equal for all stages or taps of the filter, where a tap comprises a delay line/attenuator pair. Similarly, the propagation delay between a node 24 and the adder 32 is substantially equal for all stages. In this manner, all taps of the filter have equal propagation delay and therefore delay variation among taps is minimized, allowing for accurate high-frequency operation.

In a preferred embodiment, the nodes 24 are distributed substantially equidistant from a common position, and the adder 32 is located substantially at the common position. The attenuators 30 are distributed radially about the common position and coupled between the nodes 24 and adder 32 via leg traces 36. In this manner, the propagation delays of an incident signal along delay lines are substantially equal, as are the propagation delays of the signals along the leg traces 36 and attenuators 30, from the nodes 24 to the adder.

Figure 2:
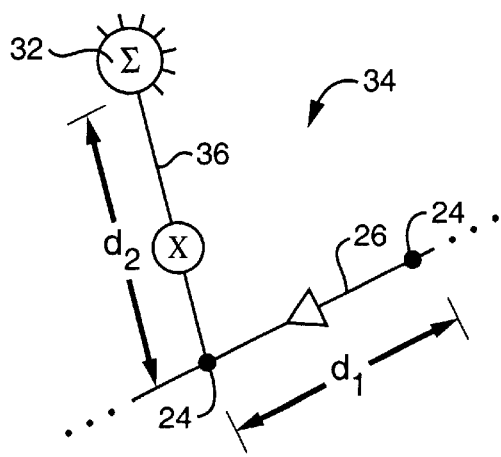
FIG. 2 illustrates a tap segment of the filter of FIG. 1 in accordance with the present invention.

FIG. 2 is a schematic illustration of a stage, or tap segment, of the filter of FIG. 1 in accordance with the present invention. Each tap 34 includes a delay line trace 26 positioned between successive nodes 24, and a leg trace 36 positioned between a node 24 and an adder 32. The layout of the respective delay lines 26, for example, the length, width, and routing of the lines 26, is such that the electrical length d1 and corresponding propagation delay are substantially the same for all taps 34. Likewise, the leg traces 36 are configured such that the electrical length d2 and corresponding propagation delay of the leg trace 36 of all taps is substantially similar.

To achieve uniformity in propagation delay for each tap 34, the nodes 24 are positioned at locations which are equidistant from the adder 32. For example, the nodes 24 may be positioned along vertices of an equilateral polygon, with the adder 32 positioned at the center of the polygon. In this manner, the respective propagation delays between nodes 24 and the respective propagation delays of leg traces 36 of the various taps are substantially equal. If layout of the components is established accurately, then delay variance on the order of less than 5 psec can be achieved on a standard multiple layered circuit board using copper-based interconnects. This allows for accurate transverse filter operation for signals in a frequency range on the order of 1 GHz to be achieved.

The attenuators 30 may comprise well-known four-quadrant multipliers employed for attenuating or strengthening the incident signal and/or changing its plurality. The attenuation parameters are preferably individually controllable such that the filter coefficients are variable over a predetermined range.

In a preferred embodiment, the delay lines 26 and leg traces 36 may comprise differential lines which are reversed in polarity at each tap for substantially reducing the effects of second order non-linear distortion. With differential lines, reduction of distortion to the order of one percent is achievable.

A preferred embodiment employs phase/amplitude equalizers 28 positioned along the delay lines 26 to avoid accumulation of phase/frequency and amplitude/frequency distortions of the delay lines at successive taps 24.

The present invention is applicable to both analog and digital signal formats. An advantage of analog format is the lack of accumulation of quantitization or discretization errors at each tap. An advantage of digital format is the lack of accumulation of linear distortion, for example phase and frequency distortion, at each tap. Therefore, in a digital system, phase/amplitude equalizers 28 are not required at each tap.

The present invention is especially applicable to systems which transform the frequency response of a signal. An example of this Partial Response Maximum Likelihood (PRML) applications used in contemporary magnetic recording systems.

While this invention has been particularly shown and described with references to preferred embodiments thereof, it will be understood by those skilled in the art that various changes in form and details may be made therein without departing from the spirit and scope of the invention as defined by the appended claims.

We claim:

1. A transverse filter comprising:

a plurality of delay lines of substantially equal propagation delay, sequentially coupled at a plurality of nodes, said nodes distributed substantially equidistant from a common position, wherein the nodes are positioned substantially at vertices of a polygon;

an adder located substantially at the common position: and a like plurality of attenuators distributed radially about the common position and coupled between the nodes and the adder such that the propagation delay of the attenuators are substantially equal.

2. The transverse filter of claim 1 wherein the delay lines are of substantially equal electrical length.

3. The transverse filter of claim 1 wherein the attenuators are of substantially equal electrical length.

4. The transverse filter of claim 1 wherein each delay line and attenuator pair forms a tap, and wherein the taps are of substantially equal electric length.

5. The transverse filter of claim 1 wherein one of the taps is an input tap for introducing an input signal to the filter.

6. The transverse filter of claim 5 wherein the input signal is delayed as it propagates through the delay lines between nodes to generate a plurality of delayed signals, and wherein the delayed signal at each node is attenuated by each attenuator to generate a plurality of attenuated signals, and wherein the attenuated signals are summed at the adder to provide an output signal.

7. The transverse filter of claim 6 wherein the propagation delays of the signals through the taps are substantially equal.

8. The transverse filter of claim 1 wherein the polygon is an equilateral polygon.

9. The transverse filter of claim 1 further comprising amplitude correctors positioned along the delay lines, between adjacent nodes.

10. The transverse filter of claim 1 further comprising phase correctors positioned along the delay lines, between adjacent nodes.

11. The transverse filter of claim 1 wherein the attenuators comprise four-quadrant multipliers.

12. A transverse filter comprising:

a plurality of delay lines of substantially equal propagation delay, sequentially coupled at a plurality of nodes, said nodes distributed substantially equidistant form a common position, wherein said nodes are positioned along a circle;

an adder located substantially at the common position; and a like plurality of attenuators distributed radially about the common position and coupled between the nodes and the adder such that the propagation delay of the attenuators are substantially equal.

13. The transverse filter of claim 12 wherein the delay lines are of substantially equal electrical length.

14. The transverse filter of claim 12 wherein the attenuators are of substantially equal electrical length.

15. The transverse filter of claim 12 wherein each delay line and attenuator pair forms a tap, and wherein the taps are of substantially equal electric length.

16. The transverse filter of claim 12 wherein one of the taps is an input for introducing an input signal to the filter.

17. The transverse filter of claim 16 wherein the input signal is delayed as it propagates through the delay lines between nodes to generate a plurality of delayed signals, and wherein the delayed signal at each node is attenuated by each attenuator to generate a plurality of attenuated signals, and wherein the attenuated signals are summed at the adder to provide an output signal.

18. The transverse filter of claim 17 wherein the propagation delays of the signals through the taps are substantially equal.

19. The transverse filter of claim 12 further comprising amplitude correctors positioned along the delay lines, between adjacent nodes.

20. The transverse filter of claim 12 further comprising phase correctors positioned along the delay lines, between adjacent nodes.

21. The transverse filter of claim 12 wherein the attenuators comprise four-quadrant multipliers.

* * * * *